United States Patent
Lee et al.

(10) Patent No.: US 7,688,925 B2
(45) Date of Patent: Mar. 30, 2010

(54) BIT-DESKEWING IO METHOD AND SYSTEM

(75) Inventors: Edward Lee, San Jose, CA (US); Arvind Bomdica, Fremont, CA (US); Lin Chen, Cupertino, CA (US); Claude Gauthier, Cupertino, CA (US); Sam Huynh, San Bruno, CA (US); Hiok-Tiaq Ng, Saratoga, CA (US); John Ling, Cupertino, CA (US); Jennifer Ho, Sunnyvale, CA (US); Siji Menokki Kandiyil, San Jose, CA (US); Gin Yee, Sunnyvale, CA (US); Joseph Macri, San Francisco, CA (US)

(73) Assignee: ATI Technologies, Inc., Markham (CA)

( * ) Notice: Subject to any disclaimer, the term of this patent is extended or adjusted under 35 U.S.C. 154(b) by 1073 days.

(21) Appl. No.: 11/195,082

(22) Filed: Aug. 1, 2005

(65) Prior Publication Data
US 2007/0036020 A1    Feb. 15, 2007

(51) Int. Cl.
*H04L 7/00* (2006.01)
(52) U.S. Cl. .............. 375/355; 375/354; 375/316; 375/219; 455/73; 713/600; 713/400; 713/502
(58) Field of Classification Search .......... 375/355, 375/354, 316, 219; 455/73; 713/600, 400, 713/502
See application file for complete search history.

(56) References Cited

U.S. PATENT DOCUMENTS

| | | | |
|---|---|---|---|
| 2002/0006177 A1* | 1/2002 | Pickering et al. | 375/371 |
| 2003/0081709 A1* | 5/2003 | Ngo et al. | 375/362 |
| 2004/0042504 A1* | 3/2004 | Khoury et al. | 370/518 |
| 2004/0213067 A1 | 10/2004 | Best et al. | |

* cited by examiner

*Primary Examiner*—David C Payne
*Assistant Examiner*—Zewdu Kassa
(74) *Attorney, Agent, or Firm*—Courtney Staniford & Gregory LLP

(57) ABSTRACT

An IO method and system for bit-deskewing are described. Embodiment includes a computer system with multiple components that transfer data among them. In one embodiment, a system component receives a forward strobe signal and multiple data bit signals from a transmitting component. The receiving component includes a forward strobe clock recovery circuit configurable to align a forward strobe sampling clock so as to improve sampling accuracy. The receiving component further includes at least one data bit clock recovery circuit configurable to align a data bit sampling clock so as to improve sampling accuracy, and to receive a signal from the forward strobe clock recovery circuit that causes the data bit sampling clock to track the forward strobe sampling clock during system operation.

29 Claims, 2 Drawing Sheets

BIT-DESKEWING IO METHOD AND SYSTEM

TECHNICAL FIELD

The invention is in the field of data transfer in computer and other digital systems.

BACKGROUND

As computer and other digital systems become more complex and more capable, methods and hardware to enhance the transfer of data between system components or elements typical continually evolve. Data to be transferred include signals representing data, commands, or any other signals. System components or elements can include different functional hardware blocks on a single integrated circuit (IC), or on different ICs. The different ICs may or may not be on the same printed circuit board (PCB). System components typically include an input/output (I/O) interface specifically designed to receive data from other system components and to transmit data to other system components. Generally speaking, existing I/O interfaces can be categorized into serial and parallel "links". Regardless of the type of I/O interface, transferred data must be synchronized between system components for proper operation. Synchronization includes accounting for or compensating for several phenomena that potentially cause errors, including signal jitter and signal skew. The phenomena include differences between component clocks, and physical attributes of the data paths that create noise and affect the integrity of the transferred signal. Current approaches to handling serial I/O and parallel I/O interfaces deal with these data synchronization issues, but have limitations.

A typical serial link embeds clock information within the data stream and extracts the clock information at the receiver using a clock recovery scheme. Such schemes are also known as per-line closed-loop timing. Guaranteeing transition density requires encoding the data, typically using 8B/10B codes. A disadvantage of this approach is that it adds bandwidth overhead and increases complexity, which hurts performance and increases cost.

A typical parallel link sends a clock signal, or strobe, with a group of N data signals (for example, N may be 8 in a double data rate dynamic random access memory (DDR DRAM)). Depending on the data rate and the level of sophistication required, one of the following "source-synchronous timing" methods is used: the receiver simply samples the data with the strobe directly if the strobe has already been shifted by half a bit time relative to the data sent by the transmitter; or if the strobe is aligned with the edge of the data sent by the transmitter, the receiver delays the strobe by the same fixed amount across the group of data to sample the data eye at the nominal center.

Each of the two parallel link approaches require very tight matching of the trace impedance and trace length across the group of data and the strobe to achieve high data rates. To alleviate this, each bit receiver can delay the strobe by a different amount to place its own clock at the center of its own data. This is sometimes called per-bit deskew. A disadvantage of this parallel scheme is that the strobe (which is usually sent across a circuit board and distributed to the group of data) is noisy, thus reducing the system timing budget. In addition, the receiver simply uses or delays the strobe, which adds jitter rather than filtering jitter. In some implementations, a strobe is transmitted for each data bit rather than for a group of bits, which increases pin counts and cost.

DETAILED DESCRIPTION

Embodiments of a bit-deskewing IO method and system are described herein. A method and system for bit-deskewing are described. In one embodiment, a system component receives a forward strobe signal and multiple data bit signals from a transmitting component. The receiving component includes a forward strobe clock recovery circuit configurable to align a forward strobe sampling clock so as to improve sampling accuracy. The receiving component further includes at least one data bit clock recovery circuit configurable to align a data bit sampling clock so as to improve sampling accuracy, and to receive a signal from the forward strobe clock recovery circuit that causes the data bit sampling clock to track the forward strobe sampling clock during system operation.

Embodiments achieve data rates similar to a serial link with per-line closed-loop timing, but without the typically associated complexity and encoding bandwidth overhead. In one embodiment these advantages are provided in an interface that includes improved performance over existing source-synchronous parallel links, but does not include the complexity and overhead (e.g., as a result of encoding a clock in a serial data stream) associated with current serial links.

Figure 1:
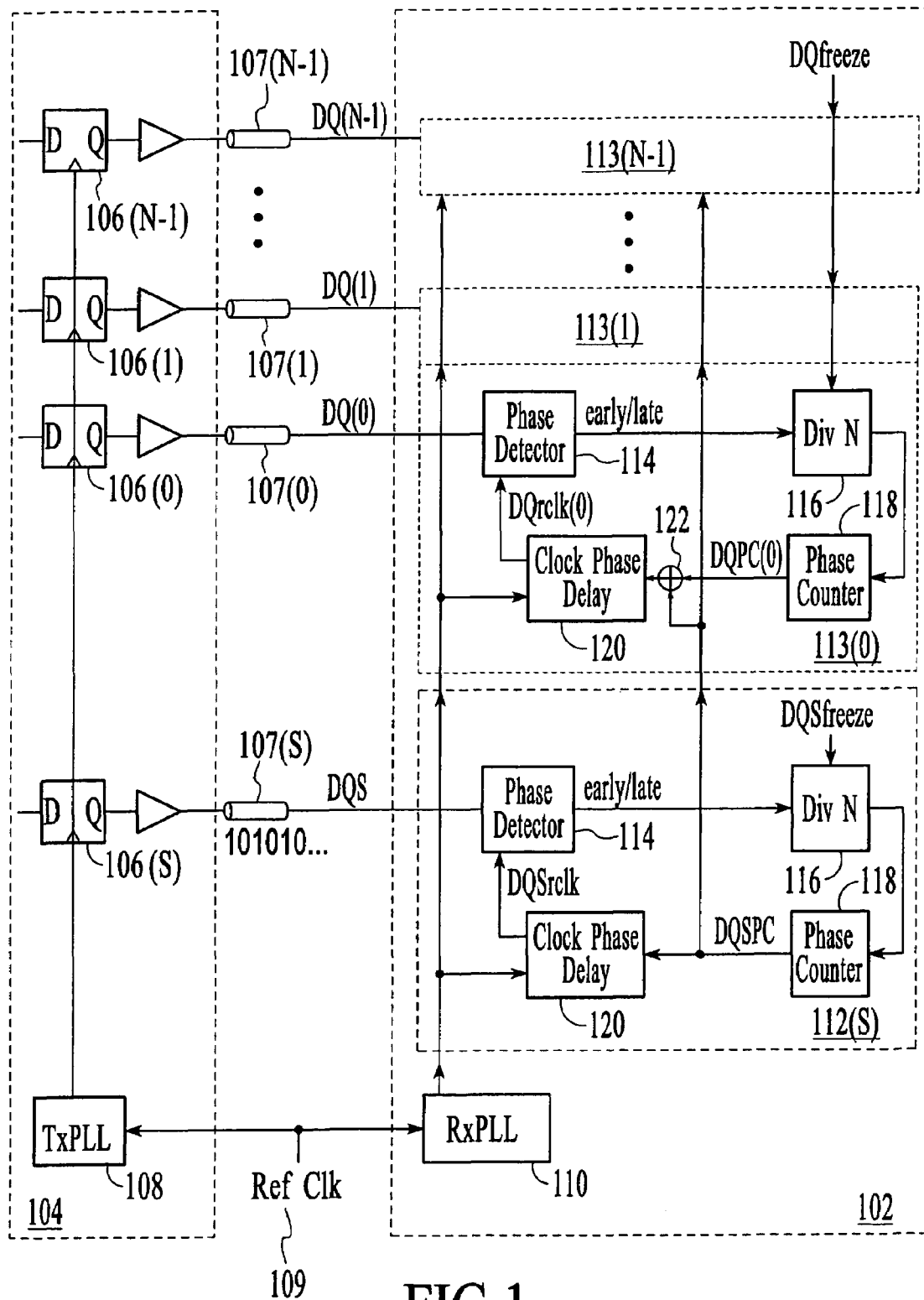
FIG. 1 is a block diagram of portions of a system including a receiver interface according to an embodiment.

FIG. 1 is a block diagram of portions of a system 100 according to an embodiment. System 100 includes a transmitter 104 and a receiver interface 102. System 100 may be any computer system or sub-system thereof, digital system, component or combination of components that transits data among components. The components may be blocks of circuitry on an integrated circuit, different integrated circuits on the same printed circuit board, or components that communicate via a network. In various embodiments, the components communicate at high speeds and high data rates. For example, system 100 may be a computer system with graphics processing or video processing unit communicating with double data rate (DDR) DRAMs, but embodiments are not so limited.

Relevant portions of the transmitter 104 are shown, including latches or flip-flops 106(0)-106(N−1) and associated output buffers. In one embodiment, the transmitter 104 transmits a strobe signal, or forward clock (labeled DQS) that is associated with data bits DQ(0)-DQ(N−1). The data bits and the forward strobe are transmitted on transmission medium 107. Transmission medium 107 in various embodiments can be one or more of a cable, a PCB trace, or any other known transmission medium. The data bits DQ are transmitted according to the communication taking place between the transmitter 104 and a receiving component that includes the receiver interface 102. The forward strobe DQS, in contrast, is continually transmitted as a toggling logic value (101010 . . . ) as shown. The transmitter 104 further includes a transmit phase lock loop (TxPLL) 108, which is a well known circuit. For example, PLLs are used as a control mechanism in most frequency synthesizers. TxPLL 108 operates in a known manner.

The receiver interface 102 includes a receive PLL (RxPLL) 110 that operates in a known manner. TxPLL 108 and RxPLL 110 both receive a reference clock signal, Ref Clk 109. The output of TxPLL 108 provides a clock signal for latches 106.

The output of RxPLL 110 is input to a clock phase delay circuit 120 for each of the data bits DQ and for the forward strobe signal DQS, as described in more detail below.

The forward strobe signal DQS is received by a clock recovery circuit 112(S) of the receiver interface 102. Receiver interface 102 also includes a separate clock recovery circuit 113 for each of the data bits DQ (clock recovery circuit 113(0) for DQ(0), clock recovery circuit 113(1) for DQ(1), etc.).

In order to help ensure that received signals, including the strobe and the data signals, are correctly sampled by the receiver interface 102, the sampling clock signal is aligned so as to optimally sample the received signals. For example, in one embodiment, the sampling clock signal is aligned to sample close to the center of the received data valid window (also referred to as the data eye). This maximizes setup and hold times and reduces the probability of sampling error. The forward strobe signal and the data bits DQ are transmitted edge-aligned. One function of the clock recovery circuits 112 and 113 in the receiver interface 102 is to adjust the phase of the received RxPLL 110 output signal so that the sample point is close to the center of the data eye. In other embodiments, the phase of the received RxPLL 110 output signal may be adjusted or aligned according to other criteria in order to improve sampling accuracy appropriately to the design of the system embodiment.

Referring to clock recovery circuit 112(S), the forward strobe DQS is received by a phase detector 114. The phase detector 114 is a known circuit, such as a comparator for example, that compares the phase of the received signal to that of the sampling clock signal and determines whether it is early or late with respect to the sampling clock signal. As further explained below, the sampling clock signal is the output of the RxPLL 110 after its phase relationship to the received signal is adjusted to be aligned with the center of the forward strobe DQS through the clock phase delay circuit 120. The output of the phase detector 114 is an early/late indication for each clock cycle. The early/late indications are input to a divider 116. The divider 116 is adjustable to reduce the number of detected early/late indications by some ratio. The output of the divider 116 is an adjusted number of early/late indications that are received by a phase counter 118. The number of early/late indications is adjusted because it may not be desirable to react to every early or late indication by adjusting the phase of the RxPLL 110 output. For example, adjusting the phase of the RxPLL 110 output in reaction to each early/late indication could cause clock dither. Therefore the early/late indications are divided by a number, for example 32, such that the phase of the RxPLL 110 output is moved for every 32 indications.

The output of the phase counter 118 is a signal DQSPC which is input to a clock phase delay circuit 120 that adjusts the delay of the RxPLL 110 output to place the RxPLL 110 output at the center of DQS. In one embodiment, the clock phase delay circuit 120 is a phase interpolator, but embodiments are not so limited. The clock phase delay circuit 120 outputs a recovered forward clock signal DQSrclk that is fed back to the phase detector circuit 114. In the present embodiments, DQSrclk will be adjusted until it is at the center of the received DQS signal to maximize the setup/hold time window. In this way the DQSrclk is compared to the received DQS signal for continual adjustment while the clock recovery circuit 112(S) is enabled or active.

According to an embodiment, the clock recovery circuit 112(S) is run in an initial "training" phase to train the circuit 112(S) in the appropriate number of delays required to center the recovered forward clock signal DQSrclk on the data eye of DQS (the received strobe signal). This number of delays is represented by the DQSPC signal. Once the clock recovery circuit 112(S) has been trained and a DQSPC signal has been obtained, the clock recovery circuit 112(S) is disabled by a DQS freeze signal input to the divider circuit 116. The DQS freeze signal has the affect of maintaining the DQSPC signal at a stable value.

The receiver interface 102 further includes data bit clock recovery circuits 113(0), 113(1), and so on, through 113(N−1) for each of the data bits DQ. In an embodiment, the data bit clock recovery circuits 113 are disabled during the training phase of the clock recovery circuit 112(S) by a common DQfreeze signal. After the clock recovery circuit 112(S) is trained and disabled, the clock recovery circuits 113 are enabled for a data clock recovery circuit training phase. In the data clock recovery circuit training phase, each of the data clock recovery circuits 113 operates to detect any phase difference between the output of the RxPLL 110 and the data eye of the respective received data signal. In one embodiment, the phase adjustment established during the training phase of the strobe clock recovery circuit 112(S), as represented by the DQSPC signal, is added to a phase adjustment determined by each clock recovery circuit 113.

With reference to the clock recovery circuit 133(0), the data signal DQ(0) is received by a phase detector circuit 114. As explained with reference to the clock recovery circuit 112(S), the output of the phase detector circuit 114 is received by an adjustable divider circuit 116. The output of the divider circuit 116 is received by a phase counter 118, which outputs a signal DQPC(0) to an adder 122. The adder 122 also receives the DQSPC signal from the strobe clock recovery circuit 112(S), and adds the received signals to generate an input to a phase delay circuit 120. The DQPC signal is an intermediate clock offset that is added to the DQSPC clock offset to generate the data clock offset signal that is input to the clock phase delay circuit 120. The input from the adder 122 to the clock phase delay circuit 120 indicates an amount by which the RxPLL 110 output should be delayed. The output of the clock phase delay circuit 120 is a recovered clock signal for data bit DQ(0), or DQrclk(0).

Each of the data clock recovery circuits 113 goes through a similar training phase to arrive at a DQPC signal and a DQrclk signal. The training phases for the different clock recovery circuits 113 can occur simultaneously or at different times. When all of the data clock recovery circuits 113 are trained, they are all disabled with the DQfreeze signal. Disabling the data clock recovery circuits 113 prevents the DQPC signals of respective circuits 113 from changing.

During normal system operation, the strobe clock recovery circuit 112(S) is enabled once again and runs freely while the component containing the receiver interface 102 is operational. Thus, the circuit 112(S) will adjust DQSPC as required to keep the DQSrclk in the center of the received forward strobe (DQS). The data clock recovery circuits, on the other hand, remain disabled during normal system operation. Because each of the data clock recovery circuits receive DQSPC, however, the phase adjustment or offset of the signal that clocks each of the data bits (DQ(0) through DQ(N−1)) will be adjusted to track any DQSPC change. The data thus "tracks" the forward strobe. That is, the data and the forward strobe move together because their respective sampling clocks move together. This is effective because the relationship of each data signal to the forward strobe (or the relationship between the respective sampling clocks of each data signal and the forward strobe) was established during the training phases and should not vary greatly, given that they each should see similar environment changes.

Figure 2:
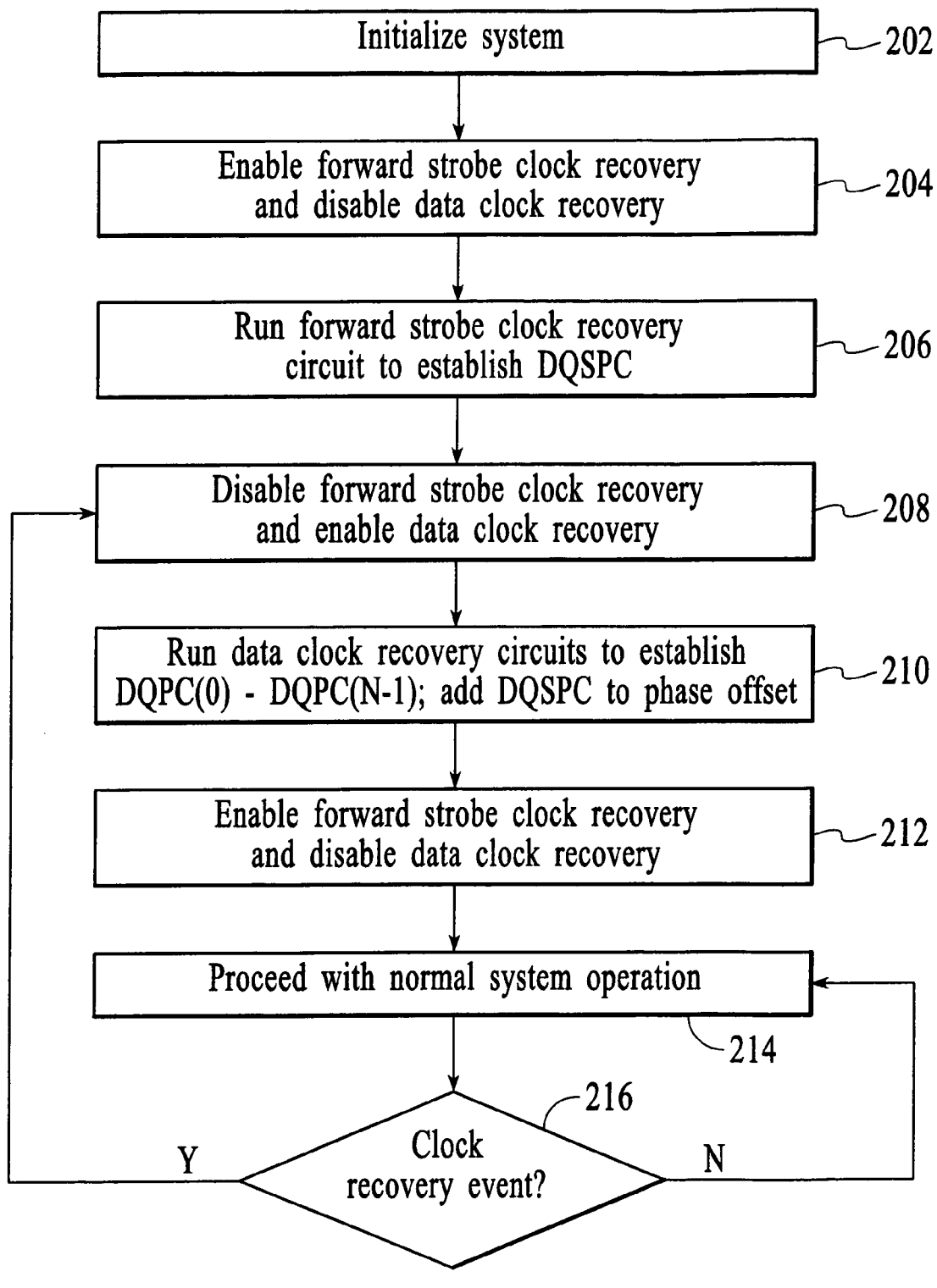
FIG. 2 is a more flow diagram of a method performed by circuitry of FIG. 1 according to an embodiment.

FIG. 2 is a flow diagram illustrating a bit-deskewing method 200 that can be performed by the system of FIG. 1 according to an embodiment. The system initializes at 202. As part of the initialization process, the forward strobe clock recovery circuit is enabled and the data clock recovery circuit is disabled as shown at 204. At 206, the forward strobe clock recovery circuit is allowed to run in order to establish DQSPC. As previously described, the DQSPC is established when the value of DQSPC is appropriate to cause a clock phase delay circuit to place the forward strobe sampling clock DQSrclk in the center of the received forward strobe data eye. In one embodiment, the forward strobe sampling clock DQSrclk is the delayed output of a transmit PLL, RxPLL, that receives a reference clock. In one embodiment, the forward strobe clock recovery circuit is run for a predetermined amount of time (for example, one millisecond) that has been determined to be sufficient to establish DQSPC. In other embodiments additional circuitry (not shown) determines when DQSPC is established.

When DQSPC has been established, the forward strobe clock recovery circuit is disabled and the data clock recovery circuits are enabled, as shown at 208. The data clock recovery circuits are run to establish respective DQPCs at 210. As previously described with reference to FIG. 1, DQSPC is added to each DQPC phase counter output during this data clock recovery training phase.

When the DQPCs have been established, the forward strobe clock recovery circuit is enabled again and the data clock recovery circuits are disabled, as shown at 212. Normal system operation then proceeds at 214.

In various embodiments, clock recovery events during normal operation may cause one or more of the clock recovery circuits to complete another training phase during system operation. For example, in one embodiment, if one or more of the DQPC values have not changed for a predetermined number of clock cycles (for example one thousand cycles), the training processes starting at 208 are repeated. In another embodiment, the system components that contain the receiver interface 102 experience idle periods or power saving periods during which no "useful" work is done by the component. Idle periods are also clock recovery events in such embodiments. An example of such a component is a double data rate dynamic random access memory (DDR DRAM) for which a refresh cycle can be used as a clock recovery event.

In various embodiments, the control of the described circuitry is performed by a high-level system protocol. Some of the behavior of the circuitry can be specified for a particular component such that a user of the component can tailor the behavior of the circuitry through the protocol. Examples of specified behavior are values for the divider circuit, predetermined amounts of time for performing clock recovery circuit training, and which events, if any, are clock recovery events.

Aspects of the invention described above may be implemented as functionality programmed into any of a variety of circuitry, including but not limited to programmable logic devices (PLDs), such as field programmable gate arrays (FPGAs), programmable array logic (PAL) devices, electrically programmable logic and memory devices and standard cell-based devices, as well as application specific integrated circuits (ASICs) and fully custom integrated circuits. Some other possibilities for implementing aspects of the invention include: microcontrollers with memory (such as electronically erasable programmable read only memory (EEPROM)), embedded microprocessors, firmware, software, etc. Furthermore, aspects of the invention may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list, and any combination of the items in the list.

The above description of illustrated embodiments of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. The teachings of the invention provided herein can be applied to other systems, not only for the system including graphics processing or video processing or DDR DRAMs as described above. The various operations described may be performed in a very wide variety of architectures and distributed differently than described. In addition, though many configurations are described herein, none are intended to be limiting or exclusive.

In other embodiments, some or all of the hardware and software capability described herein may exist in a printer, a camera, television, handheld device, mobile telephone or some other device. The elements and acts of the various embodiments described above can be combined to provide further embodiments. These and other changes can be made to the invention in light of the above detailed description.

In general, in the following claims, the terms used should not be construed to limit the video processing method and system to the specific embodiments disclosed in the specification and the claims, but should be construed to include any processing systems that operate under the claims to provide video processing. Accordingly, the method and system is not limited by the disclosure, but instead the scope of the method and system for bit-deskewing is to be determined entirely by the claims.

While certain aspects of the method and apparatus for video processing are presented below in certain claim forms, the inventors contemplate the various aspects of the method and apparatus in any number of claim forms. For example, while only one aspect of the method and apparatus may be recited as embodied in computer-readable medium, other aspects may likewise be embodied in computer-readable medium. Accordingly, the inventors reserve the right to add additional claims after filing the application to pursue such additional claim forms for other aspects of the method and apparatus for bit-deskewing.

What is claimed is:

1. A computer readable medium having instruction stored thereon which, when operated in a system, cause the system to implement a method of data transfer, the method comprising:

training a forward strobe clock recovery circuit to determine a forward strobe sampling clock offset to be used to improve sampling accuracy;

training at least one data bit clock recovery circuit to determine a data bit sampling clock offset to be used to improve sampling accuracy, wherein the data bit sampling clock offset includes the forward strobe sampling clock offset and an intermediate data bit sampling clock offset, wherein the method implemented by the system further comprises enabling the forward strobe clock recovery circuit and disabling the data clock recovery circuit while training the forward strobe clock recovery circuit.

2. The medium of claim 1, wherein the method implemented by the system further comprises disabling the forward strobe clock recovery circuit and enabling the data clock recovery circuit while training the data clock recovery circuit.

3. The medium of claim 1, wherein the method implemented by the system further comprises enabling the forward strobe clock recovery circuit and disabling the data clock recovery circuit during system operation such that the data bit sampling clock offset tracks the forward strobe sampling clock offset.

4. The medium of claim 1, wherein the method implemented by the system further comprises:

detecting at least one clock recovery event during operation of the system; and repeating training at least one data bit clock recovery circuit.

5. The medium of claim 4, wherein the at least one clock recovery event comprises:

passage of a predetermined amount of time since a last training of the at least one data clock recovery circuit;

an idle state of a system component that includes the at least one data clock recovery circuit; and a low power state of a system component that includes the at least one data clock recovery circuit.

6. A method for transferring data in a system, the method comprising:

training a forward strobe clock recovery circuit to determine a forward strobe sampling clock offset to be used to improve sampling accuracy;

training at least one data bit clock recovery circuit to determine a data bit sampling clock offset to be used to improve sampling accuracy, wherein the data bit sampling clock offset includes the forward strobe sampling clock offset and an intermediate data bit sampling clock offset, further comprising enabling the forward strobe clock recovery circuit and disabling the data clock recovery circuit while training the forward strobe clock recovery circuit.

7. The method of claim 6, further comprising disabling the forward strobe clock recovery circuit and enabling the data clock recovery circuit while training the data clock recovery circuit.

8. The method of claim 6, further comprising enabling the forward strobe clock recovery circuit and disabling the data clock recovery circuit during system operation such that the data bit sampling clock offset tracks the forward strobe sampling clock offset.

9. The method of claim 6, further comprising:

detecting at least one clock recovery event during operation of the system; and repeating training at least one data bit clock recovery circuit.

10. The method of claim 9, wherein the at least one clock recovery event comprises:

passage of a predetermined amount of time since a last training of the at least one data clock recovery circuit;

an idle state of a system component that includes the at least one data clock recovery circuit; and a low power state of the at least one data clock recovery circuit.

11. A receiver for receiving data comprising:

a forward strobe clock recovery circuit configurable to align a forward strobe sampling clock;

at least one data bit clock recovery circuit configurable to align a data bit sampling clock and to receive a signal from the forward strobe clock recovery circuit, the at least one data bit recovery circuit configuring the data bit sampling clock to track the forward strobe sampling clock during operation, wherein the data bit sampling clock is aligned by generating a data bit clock offset in a training phase during which the at least one data bit clock recovery circuit is active, and wherein the data bit clock offset includes an intermediate data bit clock offset combined with the signal from the forward strobe clock recovery circuit, wherein the signal comprises a forward strobe clock offset; and wherein during operation of the at least one data bit clock recovery circuit configurable to align a data bit sampling clock and to receive a signal from the forward strobe clock recovery circuit, the at least one data bit clock recovery circuit is inactive, the intermediate data bit clock offset is fixed, and the data bit clock offset varies with the forward strobe clock offset.

12. The receiver of claim 11 wherein the signal received from the forward strobe clock recovery circuit comprises a forward strobe clock offset, and wherein the forward strobe clock offset is combined with an intermediate data bit clock offset to generate a data bit clock offset.

13. The receiver of claim 11, wherein:

the forward strobe clock recovery circuit aligns the forward strobe sampling clock during a forward strobe training phase, including generating a forward strobe clock offset; and the at least one data bit clock recovery circuit aligns the data bit sampling clock during a data bit training phase in which the forward strobe clock recovery circuit in inactive, wherein the signal received from the forward strobe clock is the forward strobe offset, which is combined with an intermediate data clock offset to generate a data bit clock offset.

14. The receiver of claim 11, wherein the at least one data bit clock recovery circuit comprises a data bit clock recover circuit for each of the plurality of data bits.

15. The receiver of claim 14, wherein the at least one data bit clock recovery circuit includes a phase detector that receives a respective data bit and a recovered data clock signal and outputs an early/late indication that represents a phase difference.

16. The receiver of claim 15, wherein the at least one data bit clock recovery circuit further includes a phase counter that receives the early/later indication outputs an intermediate data bit clock offset.

17. The receiver of claim 16, wherein the early/late indication is divided by a predetermined number before it is received by the phase counter.

18. The receiver of claim 16, wherein the at least one data bit clock recovery circuit further includes an adder that adds the intermediate data bit clock offset to the signal received from the forward strobe clock recovery circuit, wherein the signal comprises a forward strobe clock offset.

19. The receiver of claim 18, wherein the at least one data bit clock recovery circuit further includes a clock phase delay circuit that received an output of the adder and generates the recovered data clock signal.

20. A method for receiving data comprising:
responsive to receiving a forward strobe, a forward strobe clock recovery circuit aligning a forward strobe sampling clock;
aligning a data bit sampling clock to track the forward strobe sampling clock during operation;
wherein the forward strobe clock recovery circuit aligns the forward strobe sampling clock during a forward strobe training phase, including generating a forward strobe clock offset; and
the at least one data bit clock recovery circuit aligns the data bit sampling clock during a data bit training phase in which the forward strobe clock recovery circuit in inactive, wherein the signal received from the forward strobe clock is the forward strobe offset, which is combined with an intermediate data clock offset to generate a data bit clock offset.

21. The method of claim 20 wherein the signal received from the forward strobe clock recovery circuit comprises a forward strobe clock offset, and wherein the forward strobe clock offset is combined with an intermediate data bit clock offset to generate a data bit clock offset.

22. The method of claim 20, wherein during operation of the at least one component configurable to receive, the at least one data bit clock recovery circuit is inactive, the intermediate data bit clock offset is fixed, and the data bit clock offset varies with the forward strobe clock offset.

23. The method of claim 20, wherein:
the forward strobe clock recovery circuit aligns the forward strobe sampling clock during a forward strobe training phase, including generating a forward strobe clock offset; and
the at least one data bit clock recovery circuit aligns the data bit sampling clock during a data bit training phase in which the forward strobe clock recovery circuit in inactive, wherein the signal received from the forward strobe clock is the forward strobe offset, which is combined with an intermediate data clock offset to generate a data bit clock offset.

24. The method of claim 20, wherein the at least one data bit clock recovery circuit comprises a data bit clock recover circuit for each of the plurality of data bits.

25. The method of claim 24, wherein the at least one data bit clock recovery circuit includes a phase detector that receives a respective data bit and a recovered data clock signal and outputs an early/late indication that represents a phase difference.

26. The method of claim 25, wherein the at least one data bit clock recovery circuit further includes a phase counter that receives the early/later indication outputs an intermediate data bit clock offset.

27. The method of claim 26, wherein the early/late indication is divided by a predetermined number before it is received by the phase counter.

28. The method of claim 26, wherein the at least one data bit clock recovery circuit further includes an adder that adds the intermediate data bit clock offset to the signal received from the forward strobe clock recovery circuit, wherein the signal comprises a forward strobe clock offset.

29. The method of claim 28, wherein the at least one data bit clock recovery circuit further includes a clock phase delay circuit that received an output of the adder and generates the recovered data clock signal.

* * * * *